(12) United States Patent
Miyake et al.

(10) Patent No.: US 7,080,445 B2
(45) Date of Patent: Jul. 25, 2006

(54) METHOD FOR CONNECTING PRINTED CIRCUIT BOARDS AND CONNECTED PRINTED CIRCUIT BOARDS

(75) Inventors: Toshihiro Miyake, Inuyama (JP); Kazuyuki Deguchi, Inabe-Gun (JP); Yoshitaro Yazaki, Anjo (JP); Hiroaki Maeda, Inabe-Gun (JP); Mitsutoshi Miyazaki, Nagoya (JP); Makoto Totani, Kariya (JP); Akinari Higashida, Anjo (JP); Hiroki Miyagawa, Kariya (JP)

(73) Assignee: Denso Corporation, Kariya (JP)

( * ) Notice: Subject to any disclaimer, the term of this patent is extended or adjusted under 35 U.S.C. 154(b) by 451 days.

(21) Appl. No.: 10/284,414

(22) Filed: Oct. 31, 2002

(65) Prior Publication Data

US 2003/0079341 A1    May 1, 2003

(30) Foreign Application Priority Data

Oct. 31, 2001    (JP) .............................. 2001-335180
Oct. 31, 2001    (JP) .............................. 2001-335181

(51) Int. Cl.
*H05K 3/36* (2006.01)
(52) U.S. Cl. ............................ 29/830; 29/825; 29/831; 29/843
(58) Field of Classification Search ................. 29/830, 29/846, 848, 825, 831, 843
See application file for complete search history.

(56) References Cited

U.S. PATENT DOCUMENTS

| 5,046,238 | A | * | 9/1991 | Daigle et al. .................. 29/830 |
| 5,129,142 | A | * | 7/1992 | Bindra et al. .................. 29/852 |
| 5,401,913 | A | * | 3/1995 | Gerber et al. ................ 174/264 |
| 5,482,586 | A | * | 1/1996 | Fujikake et al. ............. 156/233 |
| 5,601,678 | A | * | 2/1997 | Gerber et al. ................ 156/150 |
| 6,163,957 | A | * | 12/2000 | Jiang et al. .................... 29/852 |
| 6,630,639 | B1 | * | 10/2003 | McSwiggen .............. 200/52 R |

OTHER PUBLICATIONS

U.S. Appl. No. 09/626,243, filed Jul. 26, 2000, Miyake.

* cited by examiner

*Primary Examiner*—Carl J. Arbes
(74) *Attorney, Agent, or Firm*—Posz Law Group, PLC

(57) ABSTRACT

A first printed circuit board includes a first insulating board substantially made of thermoplastic resin and a first conductive pattern. A second printed circuit board includes a second insulating board and a second conductive pattern. The first and second printed circuit boards are overlapped. The overlapped portion of the first and second printed circuit boards is heat pressed to connect the first and second printed circuit boards with a heat-pressing tool while the first insulating board is cooled at an area adjacent to an area pressed by the heat-pressing tool. With the heat pressing, the first and second lands are electrically connected and the thermoplastic resin is softened and plastically deformed to bond the first insulating board to the second insulating board. The thickness of the first insulating board is preferably controlled at the heat pressed area and the area adjacent to the heat pressed area by the cooling.

21 Claims, 11 Drawing Sheets

STRESS CONCENTRATED REGION

METHOD FOR CONNECTING PRINTED CIRCUIT BOARDS AND CONNECTED PRINTED CIRCUIT BOARDS

CROSS REFERENCE TO RELATED APPLICATION

This application is based on and incorporates herein by reference Japanese Patent Applications No. 2001-335180 filed on Oct. 31, 2001 and No. 2001-335181 filed on Oct. 31, 2001.

BACKGROUND OF THE INVENTION

The present invention relates to a method for connecting a flexible printed circuit board to another printed circuit board, and relates to the connected printed circuit boards.

A method for connecting a flexible printed circuit board, which includes thermoplastic resin, to a motherboard is disclosed in JP-A-2001-111209. In the method in the publication, a flexible printed circuit board 500 includes an insulating board 50 and a plurality of conductive patterns 51, which are located on the insulating board 50. A mother board 550 includes an insulating board 55 and a plurality of conductive patterns 56, which are located on the board 55. The flexible printed circuit board 500 and the mother board 550 are overlapped such that each predetermined end portion of the conductive patterns 51 and each corresponding end portion of the conductive patterns 56 confront each other with solder paste 54 in-between, as shown in FIG. 7. In FIG. 7, the conductive patterns 51, 56 are respectively covered with solder resists 52, 57. However, the solder resists 52, 57 may be omitted.

Then, the overlapped portion is heat pressed by a heat-pressing tool 60 at a temperature higher than the glass transition temperature of the resin included in the insulating board 50. With the heat pressing, each conductive pattern 51 and each corresponding conductive pattern 56 are electrically connected by the solder paste 54, and simultaneously the resin of the insulating board 50 is softened to bond the insulating board 50 to the insulating board 55 of the motherboard 550.

However, according to the above method, the insulating board 50 is extremely deformed at the area pressed by the heat-pressing tool 60 and in the proximity of the area, as shown in FIGS. 8A, 8B, and 8C. Specifically, the insulating board 50 is thinned at the heat pressed area and thickened in the proximity of the heat pressed area because a swollen portion 58 is formed by the resin extruded from the heat pressed area. As a result, when bending deformation is repeatedly applied to of the connected boards 500, 550, the stress due to the bending deformation is concentrated in the vicinity of the boundary between the swollen portion 58 and the thin heat pressed area because the swollen portion 58 is difficult to bend. As a result, the conductive patterns 51 readily break at the stress-concentrated region.

SUMMARY OF THE INVENTION

The present invention has been made in view of the above aspect. An object of the invention is to provide a method for connecting a flexible printed circuit board to another printed circuit board. With the method, the thickness of the flexible printed circuit board is preferably controlled at a heat pressed area and an area adjacent to the heat pressed area to improve the durability in the connection between the two boards.

In the present invention, a first printed circuit board and a second printed circuit board are connected by heat pressing. The first printed circuit board includes a first insulating board substantially made of thermoplastic resin and a first conductive pattern. The first conductive pattern includes a first land for electrical connection. The second printed circuit board includes a second insulating board and a second conductive pattern. The second conductive pattern includes a second land for electrical connection. The first and second printed circuit boards are overlapped. Then, the overlapped portion of the first and second printed circuit boards is heat pressed at a temperature higher than the glass transition temperature of the thermoplastic resin to connect the first and second printed circuit boards with a heat-pressing tool while the first insulating board is cooled at an area adjacent to an area pressed by the heat-pressing tool. In the heat pressing, the first land and the second land are electrically connected, and simultaneously the thermoplastic resin is softened and plastically deformed to bond the first insulating board to the second insulating board. Therefore, the thickness of the first insulating board can be preferably controlled at the heat pressed area and the area adjacent to the heat pressed area by the cooling.

Alternatively, a heat-pressing tool having a plurality of projections is used to heat press the overlapped portion of the first and second printed circuit boards. The first insulating board is thinned at the areas pressed by the projections. On the other hand, the first insulating board is thickened at the areas between the areas pressed by the projections due to the resin extruded from the areas pressed by the heat-pressing tool. Therefore, the thickness of the first insulating board can be preferably controlled at the heat pressed area and the area adjacent to the heat pressed area using the heat-pressing tool having the projections.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in detail with reference to various embodiments.

First Embodiment

Figure 1:
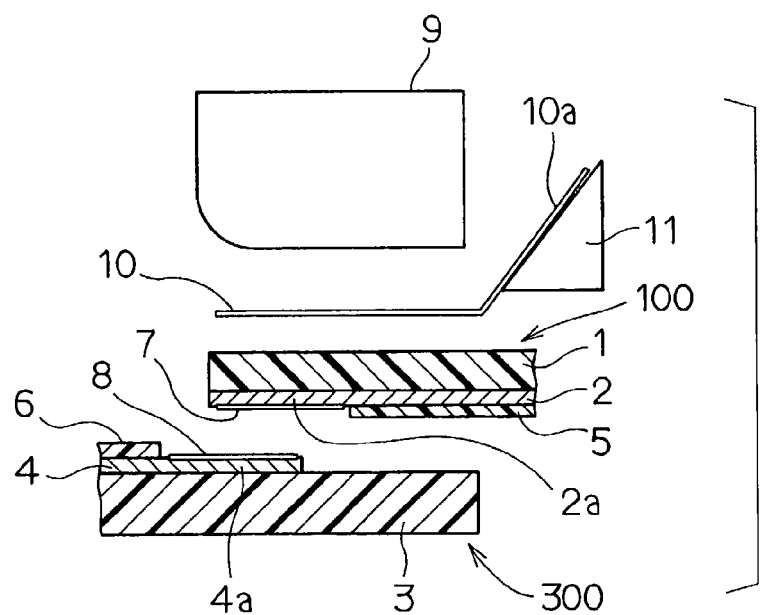
FIG. 1 is a schematic cross-sectional view showing the method according to a first embodiment for connecting a flexible printed circuit board to a rigid printed circuit board.
Figure 2A:
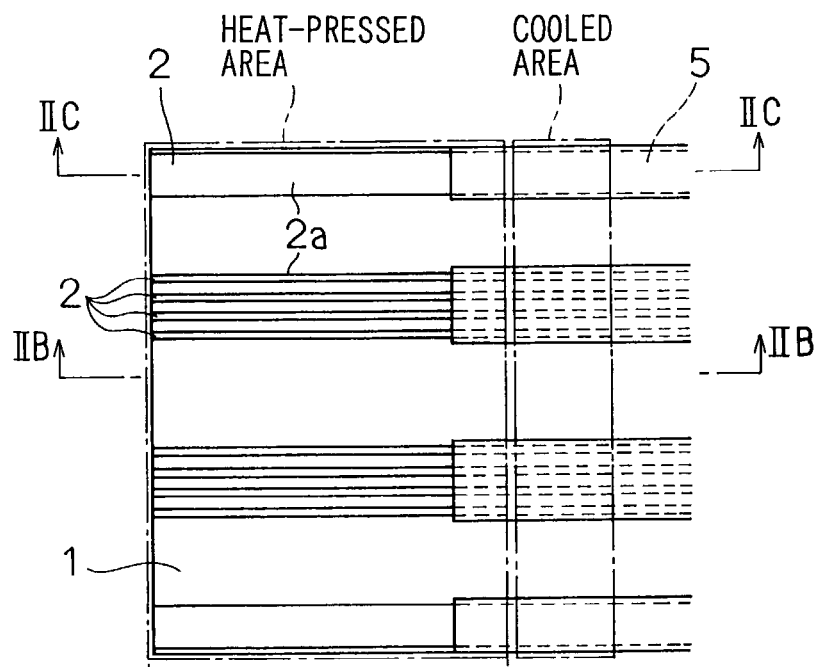
FIG. 2A is a partial plan view of the flexible printed circuit board in FIG. 1 in the upward direction of FIG. 1.

In FIG. 1, a flexible printed circuit board (FPCB) 100 (first printed circuit board) includes an insulating thermoplastic resin board 1 (first insulating board) made of a mixture of 65–35 weight % polyetheretherketone (PEEK) resin and 35–65 weight % polyetherimide (PEI) resin. The insulating thermoplastic resin board 1 is softened and the elastic modulus of it is decreased at a temperature higher than its glass transition temperature. As shown in FIGS. 1 and 2A, the FPCB 100 also includes a plurality of groups of conductive copper patterns 2 (first conductive pattern). A land 2a (first land) is located at each end of the conductive copper patterns 2 for electric connection.

The copper patterns 2 extend substantially parallel to each other in the longitudinal direction of the FPCB 100, and each end of the patterns functions as the land 2a. Except for the lands 2a, each group of copper patterns 2 is covered by a solder resist 5, which is a protective film, such that surfaces of the resin board 1 are exposed between the groups of copper patterns 2. Each solder resist 5 includes, for example, denatured epoxy resin as a main component, filler, organic solvent, hardening agent, and so on.

A rigid printed circuit board (RPCB) 300 (second printed circuit board) includes an insulating board 3 (second insulating board) made of, for example, fiberglass and epoxy resin. The RPCB 300 also includes a plurality of conductive copper patterns 4 (second conductive pattern), which are located on the surface of the insulating board 3. A land 4a (second land) is located at each end of the conductive copper patterns 4 for electric connection. Each land 4a is located at a position corresponding to each land 2a, and as shown in FIG. 1, each land 4a has a predetermined distance from an end of the RPCB 300 in the longitudinal direction of the circuit board 300. Except for the lands 4a, the copper patterns 4 are covered by a solder resist 6, which is a protective film.

A plated solder 7 is located on each land 2a of the FPCB 100. A solder leveler 8, which is a coated solder, is located on each land 4a of the RPCB 300. Therefore, each copper pattern 2 of the FPCB 100 and each corresponding copper pattern 4 of the RPCB 300 are electrically connected by connecting each land 2a and each corresponding land 4a with the plated solder 7 and the solder leveler 8 in-between, as shown in FIG. 2C. However, the connection between each pair of the lands 2a and the lands 4a is preferably made as long as a solder is formed on at least one of each pair, and the method for forming the solder is arbitrary. In FIG. 1, the plated solder 7 is made of Pb—Sn eutectic solder having a melting point of 183° C.

The RPCB 300 is formed as follows. At first, a plurality of groups of the copper patterns 4 are formed on the insulating board 3 such that each land 4a of the copper patterns 4 has a predetermined distance from an end of the RPCB 300 in the longitudinal direction of the insulating board 3. Then, the groups of the copper patterns 4 are covered by the solder resist 6 such that the insulating board 3 located in another predetermined distance from the end of the RPCB 300 are exposed. Next, each solder leveler 8 is formed on each land 4a.

The FPCB 100 is formed as follows. At first, a plurality of groups of the conductive copper patterns 2 are formed on the thermoplastic resin board 1 such that each land 2a is located at a position corresponding to each land 4a. Then, as shown in FIG. 2A, each group of the copper patterns 2 is covered by each solder resist 5 such that the resin board 1 in a predetermined distance from an end of the FPCB 100 and the resin board 1 between the groups of the copper patterns 2 are exposed. Next, each plated solder 7 is plated on each land 2a.

Subsequently, the FPCB 100 and the RPCB 300 are overlapped such that each land 4a and each corresponding land 2a confront each other with a predetermined gap between an end of each solder resist 6 and the end of the FPCB 100, as shown in FIG. 1. A portion of each land 4a is exposed through the predetermined gap. Then, the overlapped portion of the FPCB 100 and the RPCB 300 is heat pressed by a heat-pressing tool 9 with an SUS intervening member 10 in-between. The SUS intervening member 10 has a slant portion 10a at its end far from the end of the FPCB 100 in the longitudinal direction of the FPCB 100, as viewed in FIG. 1. The slant portion 10a supports a cooling member 11 that is made of a metal such as copper, which has an excellent thermal conductivity. The slant portion 10a also used to determine the position of the cooling member 11 in the longitudinal direction of the FPCB 100.

The resin board 1 of the FPCB 100 has a glass transition temperature of 150 to 230° C. The heat-pressing tool 9 heat presses the FPCB 100 and the RPCB 300 such that the resin board 1 of the FPCB 100 is heated at a temperature higher than the melting point of each solder 7, 8 and the glass transition temperature of the resin board 1. The temperature of the heat-pressing tool 9 and the period of the heat pressing are, for example, 240 to 570° C. and 5 to 15 sec, respectively.

The heat-pressing tool 9 in FIG. 1 is of a pulse heating type. As shown in FIG. 1, the heat-pressing tool 9 has a round corner at its end near from the end of the FPCB 100 in the longitudinal direction of the FPCB 100. The SUS intervening member 10 is thin enough to be deformed while conforming to the shape of the heat-pressing tool 9 when the FPCB 100 and the RPCB 300 are heat pressed. Therefore, the farther from the end of the FPCB 100 in the longitudinal direction of the FPCB 100, the more firmly each land 2a of the copper patterns 2 is pressed. As a result, the melted solder between each land 2a and corresponding land 4a is extruded toward the end of the FPCB 100. As shown in FIG. 2C, the extruded solder pushes up the end of the FPCB 100. However, it is possible to prevent the extruded solder from bridging the gap between a pair of connected lands 2a, 4a and another pair of connected lands 2a, 4a, and prevent the two pair of connected lands 2a, 4a from being electrically connected to each other because there is the predetermined gap for releasing the extruded solder between the end of each solder resist 6 and the end of the FPCB 100, as described above. The extruded solder that is exposed at the gap is covered with an insulating resin and so on after the heat pressing of the FPCB 100 and the RPCB 300 is completed.

When the overlapped portion of the FPCB 100 and the RPCB 300 is heat pressed by the heat-pressing tool 9, the solders 7, 8 melt to connect each land 2a of the copper patterns 2 to the corresponding land 4a of the copper pattern 4, and simultaneously the resin board 1 of the FPCB 100 is softened to bond to the insulating board 3. The bonded area is actually larger than the heat pressed area shown in FIG. 2A because the resin board 1 is heated even outside the heat pressed area due to thermal conduction from the heat-pressing tool 9. In the method of FIG. 1, the cooling member 11 cools the FPCB 100 at an area adjacent to the heat pressed area, as shown in FIG. 2A, so the resin board 1 is less deformed at the cooled area than in the case that the area is not cooled as in the proposed method shown in FIGS. 7, 8A, 8B, and 8C.

Figure 2B:
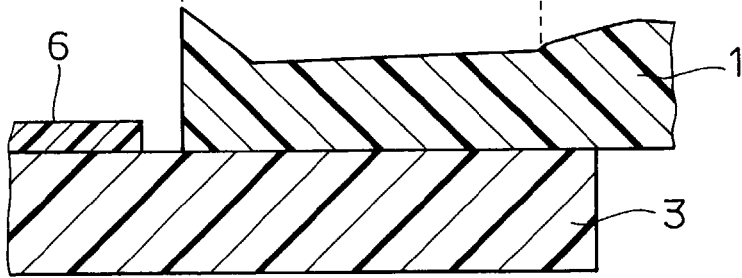
FIG. 2B is a cross-sectional view, which is taken along the line IIB—IIB in FIG. 2A, of the connected portion of the flexible printed circuit board and the rigid printed circuit board in FIG. 1.
Figure 2C:
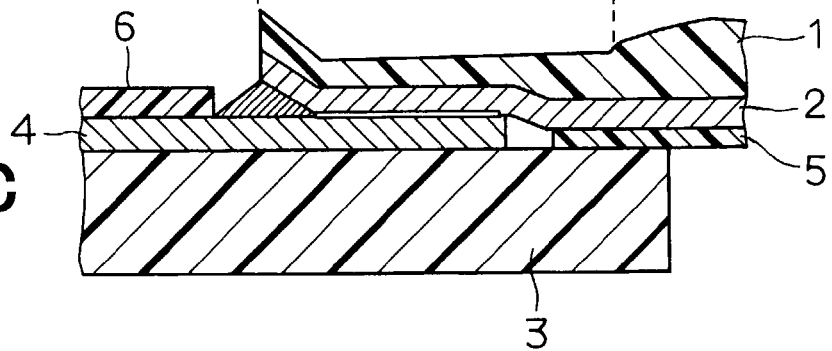
FIG. 2C is a cross-sectional view, which is taken along the line IIC—IIC in FIG. 2A, of the connected portion of the flexible printed circuit board and the rigid printed circuit board in FIG. 1.

Therefore, a swollen portion, which is formed by the resin extruded from the heat pressed area, is not generated in the cooled area adjacent to the heat pressed area, as shown in FIGS. 2B and 2C. Instead, the thickness of the resin board 1 gradually increases in the cooled area. In addition, the resin board 1 is prevented from undesirably thinning at the heat pressed area because the extrusion of the resin is suppressed. Thus, even when a bending deformation is applied to the connected portion of the FPCB 100 and the RPCB 300, the stress due to the bending deformation is prevented from concentrating at an area where the resin board 1 is undesirably thin, as in the proposed method, in which the stress concentrates in the vicinity of the boundary between the swollen portion 58 and the thin heat pressed area. As a result, the FPCB 100 in FIGS. 2B and 2C has better durability against bending deformation than the FPCB 500 in FIGS. 8B and 8C.

Figure 3:
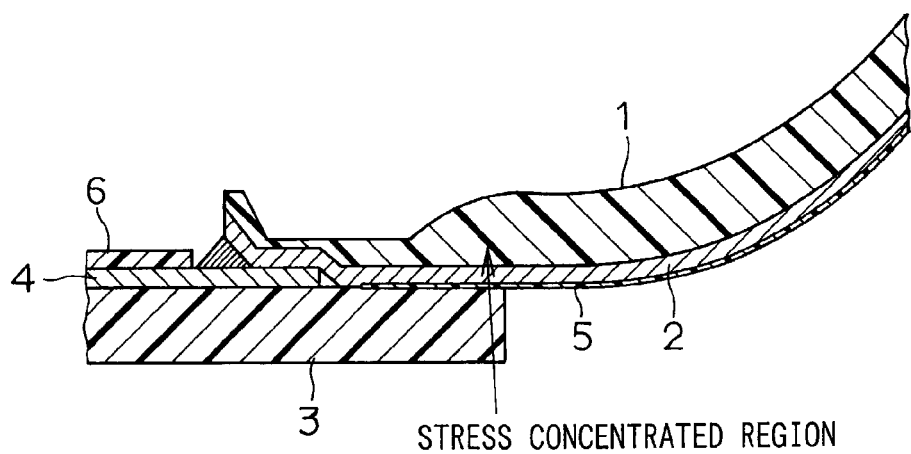
FIG. 3 is a schematic cross-sectional view showing a state of the flexible printed circuit board and the rigid printed circuit board when the boards are bended after being connected together with the method in FIG. 1.

In the FPCB 100, each solder resist 5 covers each group of copper patterns 2 while the surfaces of the resin board 1 are exposed between the groups of copper patterns 2. Therefore, after the FPCB 100 and the RPCB 300 are heat pressed, the resin board 1 is relatively thick on the surfaces between the groups of copper patterns 2 because of the absence of the solder resists 5, as shown in FIG. 2B. In addition, the resin board 1 is bonded to the insulating board 3 at the surfaces between the groups of copper patterns 2. Therefore, as shown in FIG. 3, it is possible to shift the stress concentrated region due to bending deformation from where the resin board 1 is undesirably thin to where it is thick enough. As a result, the FPCB 100 in FIGS. 2B and 2C has even better durability against bending deformation than the FPCB 500 in FIGS. 8B and 8C.

As shown in FIG. 2C, each land 4a has a predetermined distance from the end of the RPCB 300, so it is possible to permit the bonded area between the resin board 1 and the insulating board 3 at the exposed surfaces of the insulating board 3 between the groups of copper patterns 2 to become larger.

Figure 8A:
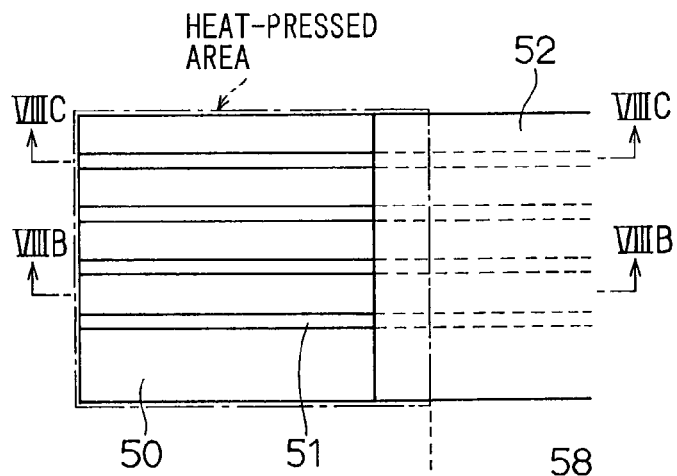
FIG. 8A is a partial plan view of the flexible printed circuit in FIG. 7 in the upward direction of FIG. 7.
Figure 8B:
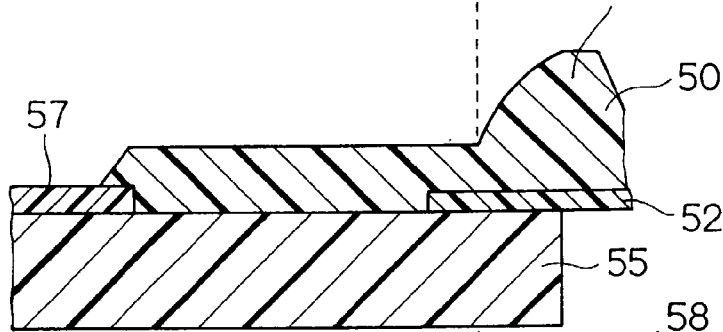
FIG. 8B is a cross-sectional view, which is taken along the line VIIIB—VIIIB in FIG. 8A, of the connected portion of the flexible printed circuit board and the motherboard in FIG. 7.
Figure 8C:
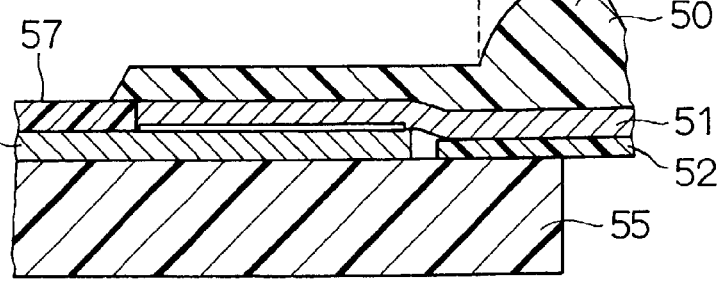
FIG. 8C is a cross-sectional view, which is taken along the line VIIIC—VIIIC in FIG. 8A, of the connected portion of the flexible printed circuit board and the motherboard in FIG. 7.

In the method shown in FIG. 1, the cooling member 11 is fixed to the slant portion 10a of the SUS intervening member 10 at a predetermined position to cool the resin board 1 at an area adjacent to the heat pressed area during the heat pressing. Therefore, the resin board 1 does not have excessive fluidity at the cooled area adjacent to the heat pressed area. Thus, the swollen portion 58 shown in FIGS. 8B and 8C is not generated in the method shown in FIG. 1. In addition, the resin board 1 is also pressed by the cooling member 11 at the area adjacent to the heat pressed area during the heat pressing, so it contributes to make the actual bonded area between the resin board 1 and the insulating board 3 larger than the heat-pressed area in FIG. 2A.

In the method shown in FIG. 1, the cooling member 11 is used to cool the resin board 1 at the area adjacent to the heat pressed area during the heat pressing. However, it is possible to cool the resin board 1 there by a cool air blow instead of the cooling member 11.

Second Embodiment

Figure 4:
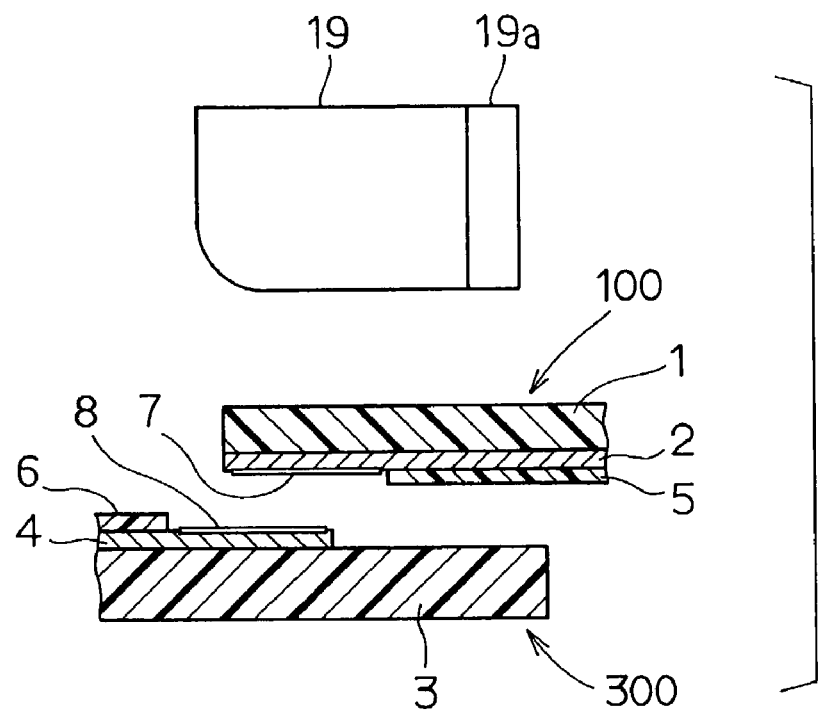
FIG. 4 is a schematic cross-sectional view showing the method according to a second embodiment for connecting a flexible printed circuit board to a rigid printed circuit board.
Figure 5:
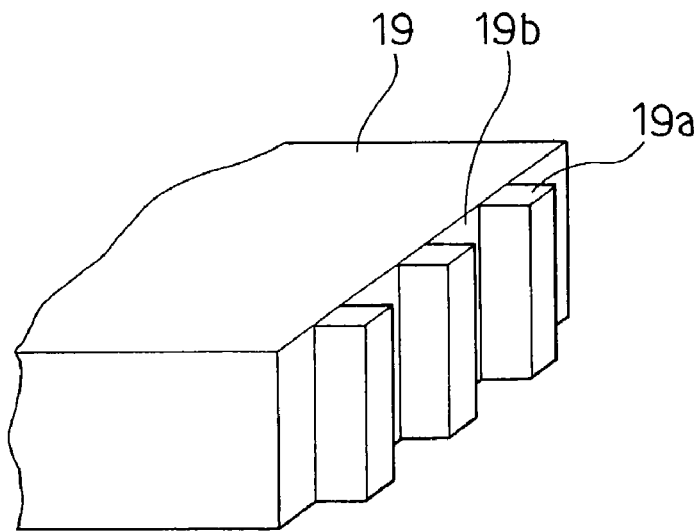
FIG. 5 is a partial perspective view showing a heat-pressing tool used in the method of FIG. 4.

In the method shown in FIG. 4, neither the SUS intervening member 10 nor the cooling member 11, which are shown in FIG. 1, are used. Instead, as shown in FIGS. 4 and 5, a heat-pressing tool 19 has a plurality of projections 19a, which define a plurality of recesses 19b, at its end far from an end of an FPCB 100 in the longitudinal direction of the FPCB 100.

Figure 6A:
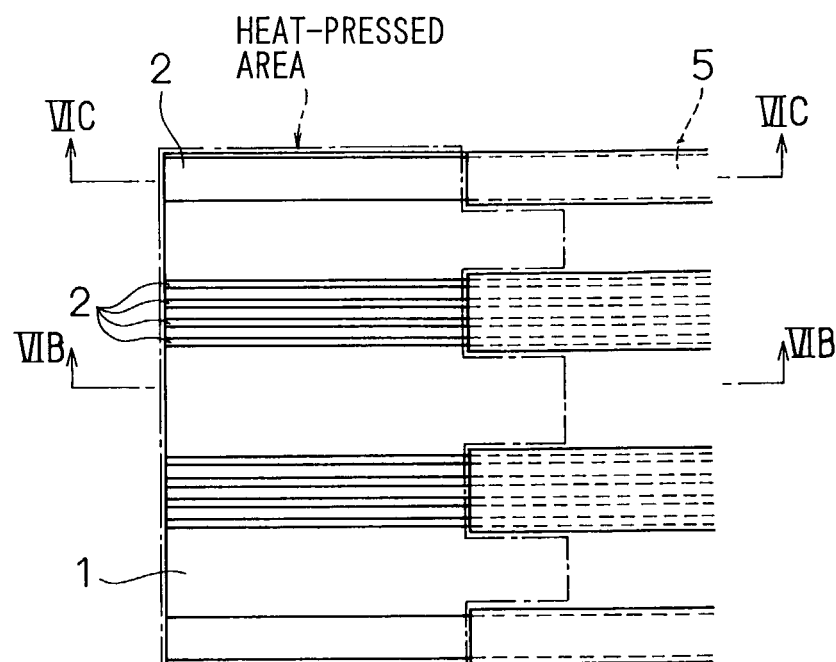
FIG. 6A is a partial plan view of the flexible printed circuit board in FIG. 4 in the upward direction of FIG. 4.
Figure 6B:
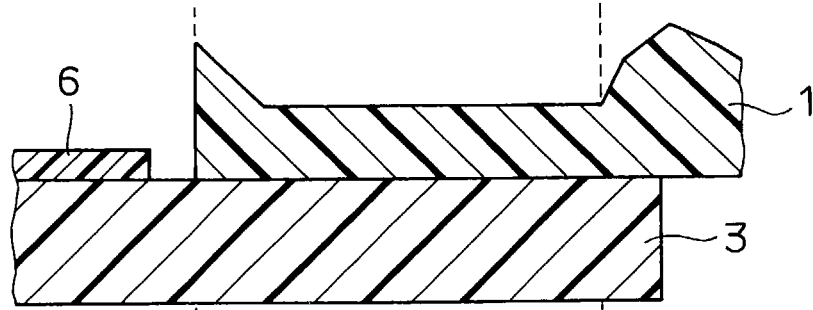
FIG. 6B is a cross-sectional view, which is taken along the line VIB—VIB in FIG. 6A, of the connected portion of the flexible printed circuit board and the rigid printed circuit board in FIG. 4.
Figure 6C:
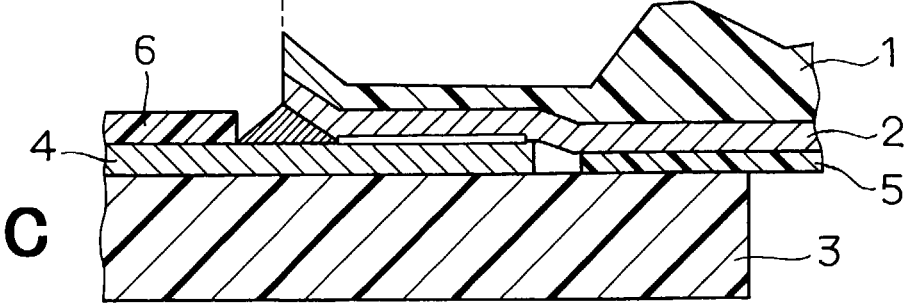
FIG. 6C is a cross-sectional view, which is taken along the line VIC—VIC in FIG. 6A, of the connected portion of the flexible printed circuit board and the rigid printed circuit board in FIG. 4.
Figure 7:
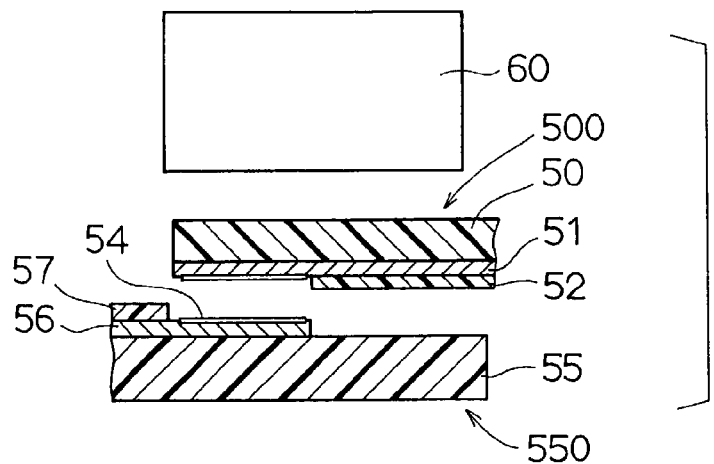
FIG. 7 is a schematic cross-sectional view showing a proposed method for connecting a flexible printed circuit board to a motherboard.

At first, the FPCB 100 and an RPCB 300 are prepared in the same manner as described in the first embodiment. Then, as the method shown in FIG. 4, the FPCB 100 and the RPCB 300 are overlapped in the same manner as described in the first embodiment. Next, the overlapped portion of the FPCB 100 and the RPCB 300 is heat pressed by the heat-pressing tool 19 at a heat pressed area shown in FIG. 6A. At that time, as shown in FIG. 6A, a resin board 1 of the FPCB 100 is heat pressed by the projections 19a of the heat-pressing tool 19 between groups of copper patterns 2. Therefore, as shown in FIG. 6B, the resin board 1 is thinned at the areas pressed by the projections 19a. On the other hand, as shown in FIG. 6C, the resin board 1 is thickened at the areas corresponding to the recesses 19b due to the resin extruded from the areas pressed by the heat-pressing tool 19. As a result, the resin board 1 is reinforced at the areas corresponding to the recesses 19b.

As shown in FIG. 6A, each solder resist 5 covers each group of copper patterns 2 while the surfaces of the resin board 1 are exposed between the groups of copper patterns 2, so the resin board 1 is bonded to an insulating board 3 of the RPCB 300 at the areas between the groups of copper patterns 2 when the area are heat pressed by the recesses 19b. Therefore, when a bending deformation is applied to the connected portion of the FPCB 100 and the RPCB 300, the stress concentrated region due to the bending deformation is distributed not only in the relatively thin areas that are pressed by the projections 19a but also in the relatively thick areas corresponding to the recesses 19b. Therefore, the FPCB 100 in FIGS. 6A, 6B, and 6C has better durability against bending deformation than the FPCB 500 in FIGS. 8B and 8C.

Moreover, after the FPCB 100 and the RPCB 300 are heat pressed, the resin board 1 is relatively thick between the groups of copper patterns 2 because of the absence of the solder resists 5, as shown in FIG. 6B. As a result, the FPCB 100 in FIGS. 6A, 6B, and 6C has even better durability against bending deformation than the FPCB 500 in FIGS. 8B and 8C.

The methods of FIGS. 1 and 4, the second printed circuit board is not limited to the RPCB 300. It may be an FPCB that includes thermoplastic resin. Moreover, the insulating board 3 of the RPCB 300 may be made of ceramics or metal. The resin board 1 of the FPCB 100 may be made of PEI or PEEK alone. Alternatively, the resin board 1 may be liquid crystal polymer, polyethylenenaphthalate (PEN), or polyethylenetelephthalate (PET). The resin board 1 may also be a resin board, in which a polyimide board is laminated with at least one thermoplastic resin of PEEK, PEI, PEN, and PET. The lamination may be carried out using an adhesive. A FPCB including a polyimide board is prevented from peeling or warping because the thermal expansion coefficient of polyimide is 15–20 ppm and the value is close to a thermal expansion coefficient of 17–20 ppm of copper, which is a typical material used for wiring.

The shape of the lands 2a, 4a of the copper patterns 2, 4 may be rectangular, circular, and so on. The solder resists 5 that protect the copper patterns 2 may be omitted as long as there is no problem with the insulation of the copper patterns 2. The solder resist 5 may cover the surfaces of the resin board 1 between the groups of copper patterns 2 outside the heat pressed area as long as the surfaces are exposed between the groups of copper patterns 2 in the heat pressed area. Instead of the solder resist 5, the copper patterns 2 may be covered with a cover layer made of one of the thermoplastic resins mentioned above. In that case, the cover layer may cover the surfaces of the resin board 1 between the groups of copper patterns 2 in the same manner the solder resist 52 does in FIG. 8A.

The solder resists 5, which include denatured epoxy resin as a main component, have an insufficient bonding strength with the insulating board 3, which includes epoxy resin, and the solder resist 6, which has the same composition as the solder resists 5 and is located on the insulating board 3. However, if the above cover layer, which includes thermoplastic resin such as the mixture of 65–35 weight % PEEK and 35–65 weight % PEI, PEEK, PEI, PEN, and PET, is used instead of the solder resist 5, the bonding strength between the FPCB 100 and the RPCB 300 becomes relatively high because the cover layer strongly bonds to the epoxy resin included in the insulating board 3.

In the methods of FIGS. 1 and 4, the FPCB 100 and the RPCB 300 are connected such that the FPCB 100 and the RPCB 300 respectively have the heat pressed area at their longitudinal end and extend from the heat pressed area in the opposite direction. However, the FPCB 100 and the RPCB 300 may be connected such that the FPCB 100 and the RPCB 300 respectively have the heat pressed area at their longitudinal end and extend from the heat pressed area in the same direction. Moreover, the FPCB 100 and the RPCB 300 may be connected such that the FPCB 100 and the RPCB 300 have the heat pressed area at a position except for their longitudinal end.

Third Embodiment

Figure 9:
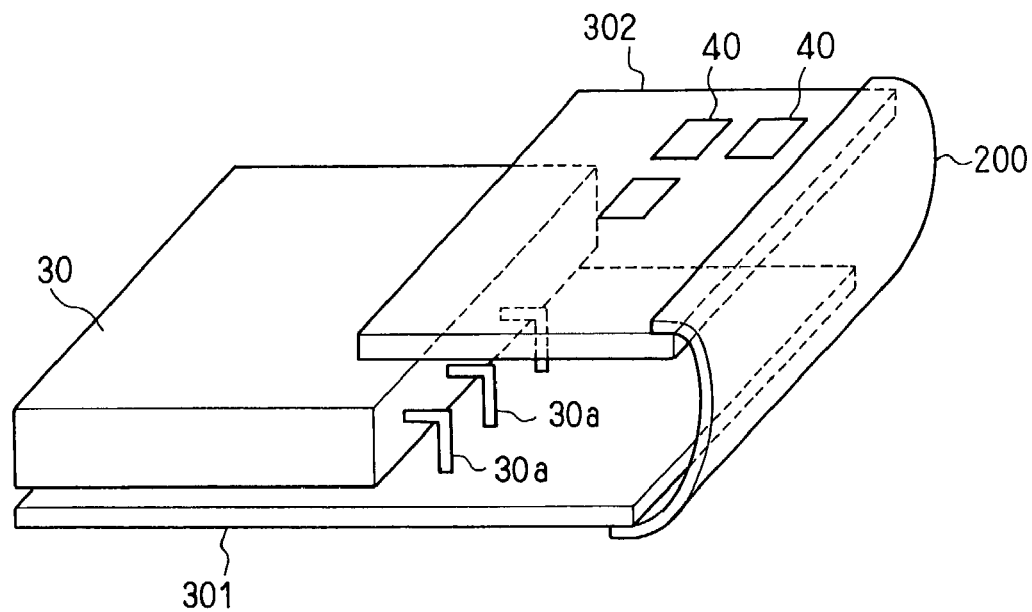
FIG. 9 is a schematic partial perspective view of an electronic device, in which a flexible printed circuit board is connected to two rigid printed circuit boards using the method according to a third embodiment.
Figure 10A:
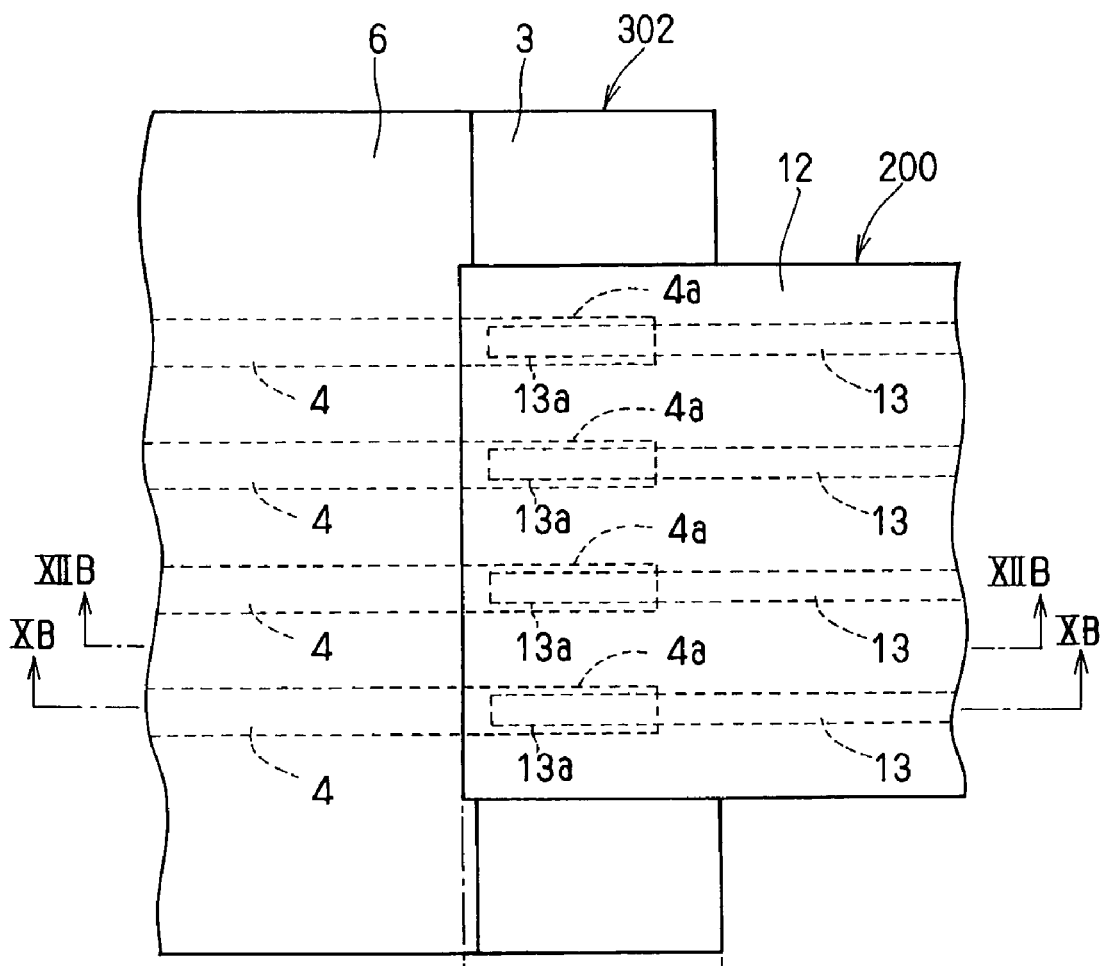
FIG. 10A is a plan view of the connected portion of the printed circuit boards in FIG. 9.
Figure 10B:
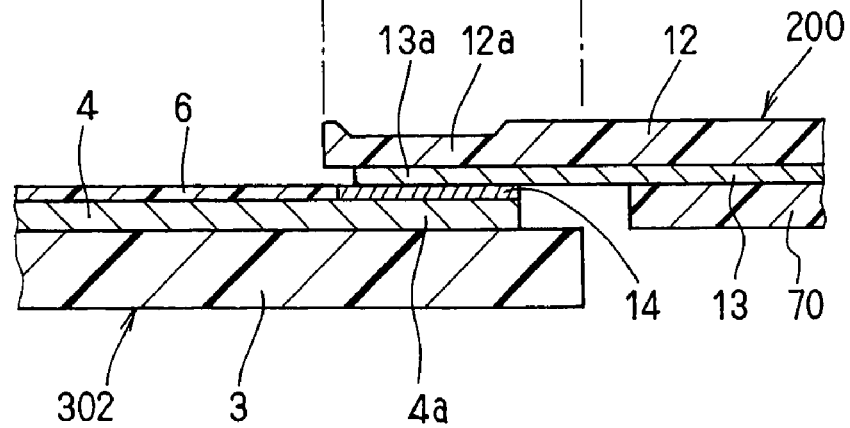
FIG. 10B is a cross-sectional view taken along the line XB—XB in FIG. 10A.

An FPCB 200, which is a first printed circuit board, an RPCB 301, which is a second printed circuit board, and another RPCB 302, which is another second printed circuit board, are included in an electronic device, as shown in FIG. 9. The RPCB 301 and the RPCB 302 are supported substantially parallel to each other, and electrically connected by the FPCB 200. A variety of electronic components are assembled on the RPCB 301, although only a dual in-line package IC 30, which is electrically connected to the RPCB 301 with leads 30a, is illustrated in FIG. 9. Similarly, a variety of electronic components 40 are assembled on the RPCB 302. As shown in FIGS. 10A and 10B, the FPCB 200 includes an insulating thermoplastic resin board 12, which is made of PEN having a melting point of about 260° C., and the RPCB 302 includes an insulating board 3 made of fiberglass and epoxy resin. Similarly, the RPCB 301 includes an insulating board, which is not shown, made of fiberglass and epoxy resin.

As shown in FIGS. 10A and 10B, the RPCB 302 includes a plurality of conductive copper patterns 4, which are located on the insulating board 3. A land 4a is located at each end of the conductive copper patterns 4 for electric connection. Except for each land 4a, each copper pattern 4 is covered by a solder resist 6, which is a protective film. On the other hand, the FPCB 200 includes a plurality of conductive silver patterns 13, which are located on the insulating thermoplastic resin board 12. A land 13a is located at each end of the conductive silver patterns 13 for electric connection. Except for each land 13a, each silver pattern 13 is covered by a cover film 70, which is a protective film. The silver patterns 13 have a thickness of about 8 μm. The silver patterns 13 are wires that extend substantially parallel to each other in the longitudinal direction of the FPCB 200, and each end of the wires functions as the land 13a.

As shown in FIG. 10A, each land 4a of the conductive copper patterns 4 is connected to each corresponding land 13a of the silver patterns 13 with a solder 14 when the overlapped portion of the FPCB 200 and the RPCB 302 is heat pressed. Simultaneously, the insulating thermoplastic resin board 12 is bonded to the insulating board 3 in the heat pressed area. As shown in FIG. 10B, the insulating thermoplastic resin board 12 is thinned to 40 to 80% of its original thickness at a heat-pressed portion 12a.

Figure 11A:
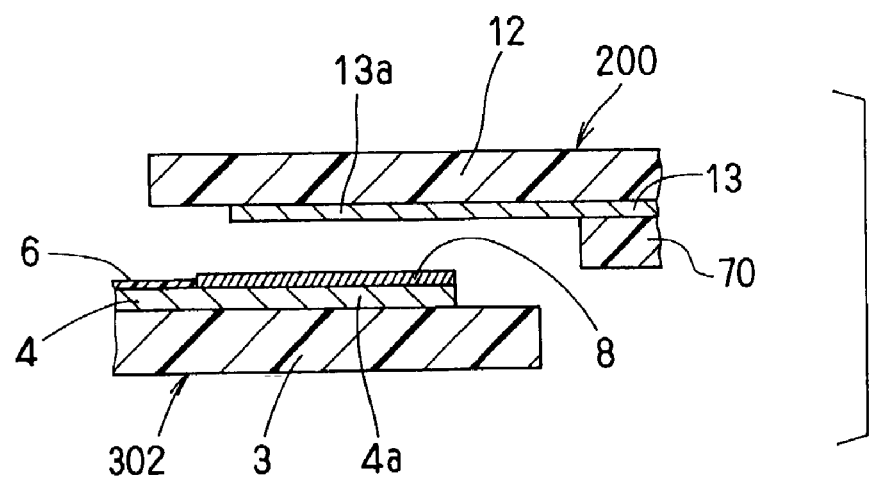
FIGS. 11A and 11B are schematic cross-sectional views showing the method according to the third embodiment.

The connection of the FPCB 200 and the RPCB 302 in FIGS. 10A and 10B is carried out as follows. At first, a FPCB 200 shown in FIG. 11A is formed as follows. A plurality of conductive silver patterns 13 are formed on a thermoplastic resin board 12, which has a thickness of 25 to 150 μm, by printing silver paste. Then, the silver patterns 13 are covered by a cover film 70 except for the area where the FPCB 200 and the RPCB 302 are connected later. Subsequently, the RPCB 302 shown in FIG. 11A is formed as follows. A plurality of copper patterns 4 are formed on the insulating board 3 by etching a copper foil, which has a thickness of 18 to 50 μm, after the copper foil is laminated on the insulating board 3. Then, the copper patterns 4 are covered by the solder resist 6 except for the area where the FPCB 200 and the RPCB 302 are connected later. Next, a solder leveler 8 is formed on each land 4a. The connection between each pair of the lands 13a and the lands 4a is preferably made as long as a solder is formed on at least one of each pair, and the method for forming the solder is arbitrary. In FIG. 11A, each solder leveler 8 is made of Pb—Sn eutectic solder having a melting point of 183° C.

Figure 11B:
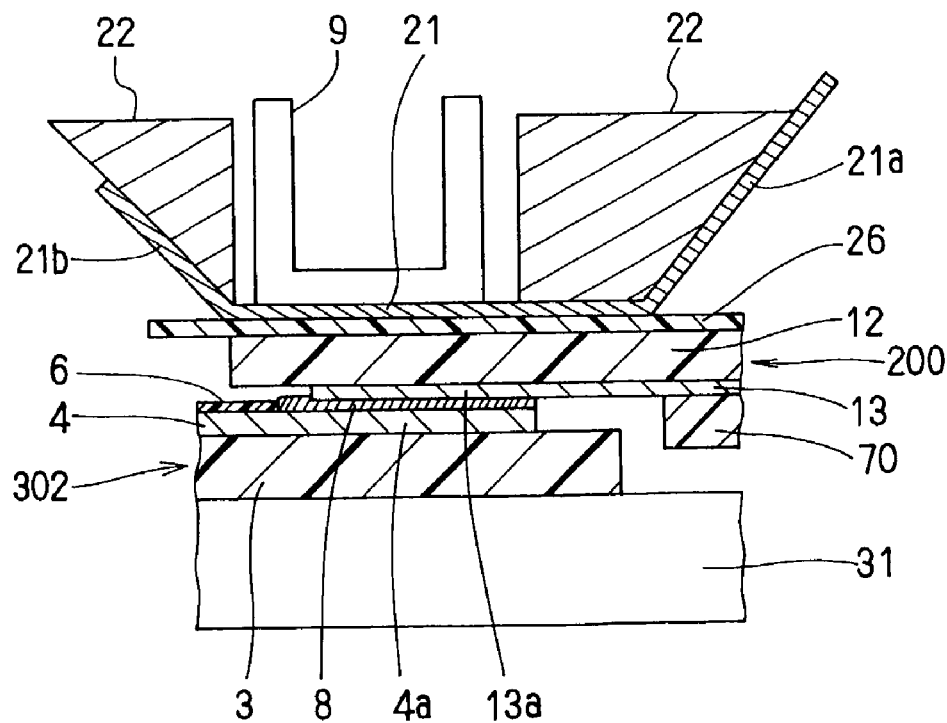

Subsequently, the FPCB 200 and the RPCB 302 are overlapped such that each land 4a and each corresponding land 13a confront each other. Then, as shown in FIG. 11B, the overlapped portion of the FPCB 200 and the RPCB 302 is heat pressed by a heat-pressing tool 9 with an intervening SUS member 21 and a separator 26 in-between. The separator 26 is a film made of Teflon®. The separator 26 prevents the resin board 12 from sticking to the intervening SUS member 21 The intervening SUS member 21 transmits heat and pressing force from the heat-pressing tool 9 to the FPCB 200 and the RPCB 302. The intervening SUS member 21 has a pair of slant portions 21a, 21b at its ends in the longitudinal direction of the FPCB 200, as viewed in FIG. 11B. A cooling member 22, which is made of a metal having an excellent thermal conductivity such as copper, is supported by the intervening SUS member 21. The cooling member 22 is positioned by the slant portions 21a, 21b in the longitudinal direction of the FPCB 200.

Figure 13:
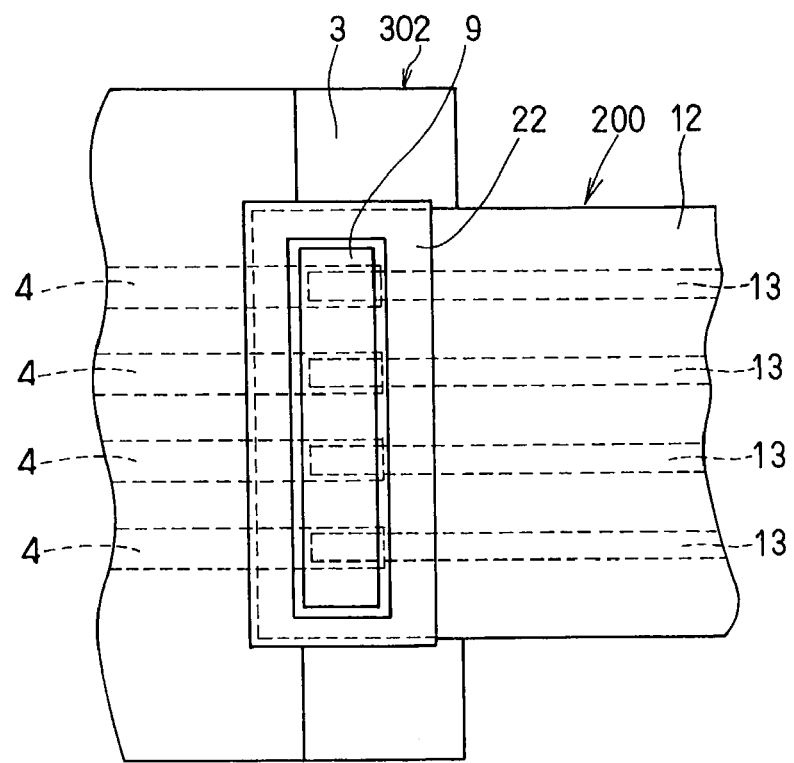
FIG. 13 is a schematic plan view showing the method according to the third embodiment.

As shown in FIG. 13, the cooling member 22 is in the shape of a frame and encloses the heat-pressing tool 9. The intervening SUS member 21 is made from a SUS plate having a thickness of 0.1 mm and a thermal conductivity of about 0.15 W/mm° C. The melting point of PEN, of which the resin board 12 of the FPCB 200 is made, is about 260° C. The heat-pressing tool 9 heat presses the FPCB 200 and the RPCB 300 such that the heat pressed area of the FPCB 200 and the RPCB 300 is heated at a temperature higher than the melting point of the solder leveler 8 and the melting point of PEN. The temperature, the pressure, and the period of the heat pressing are, for example, 270 to 340° C., 1 to 6 MPa, and 5 to 15 sec, respectively. The heat-pressing tool 9 in FIG. 11B is of a pulse heating type.

Figure 12A:
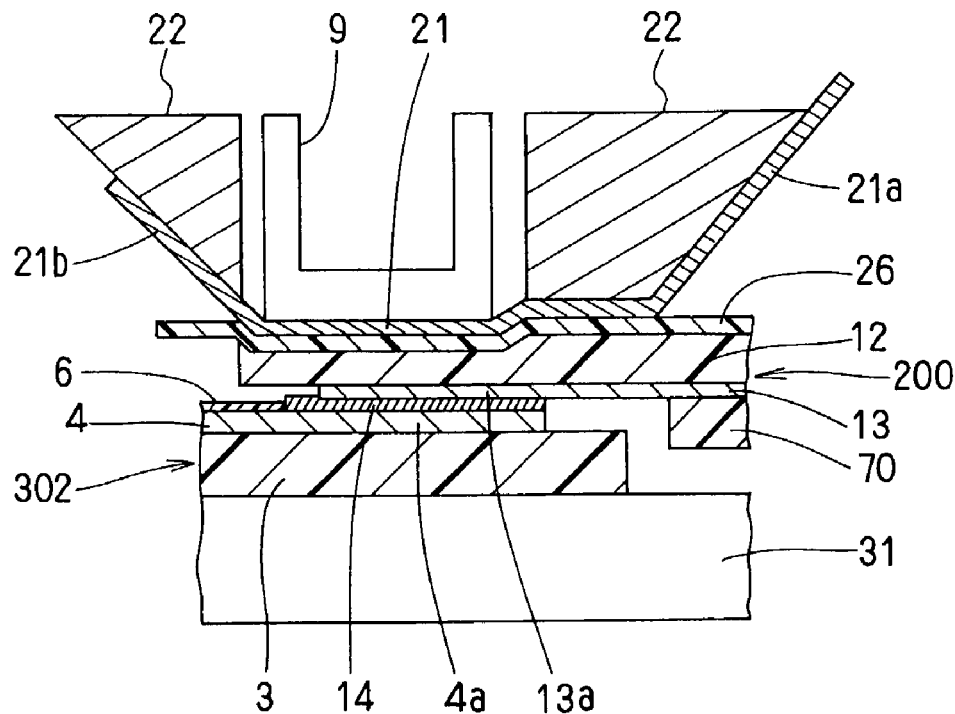
FIGS. 12A and 12B are respectively a cross-sectional view, which is taken along the line XB—XB in FIG. 10A, and a cross-sectional view, which is taken along the line XIIB—XIIB in FIG. 10A, each of which shows the state of the flexible printed circuit board and the rigid printed circuit board during the heat pressing.
Figure 12B:
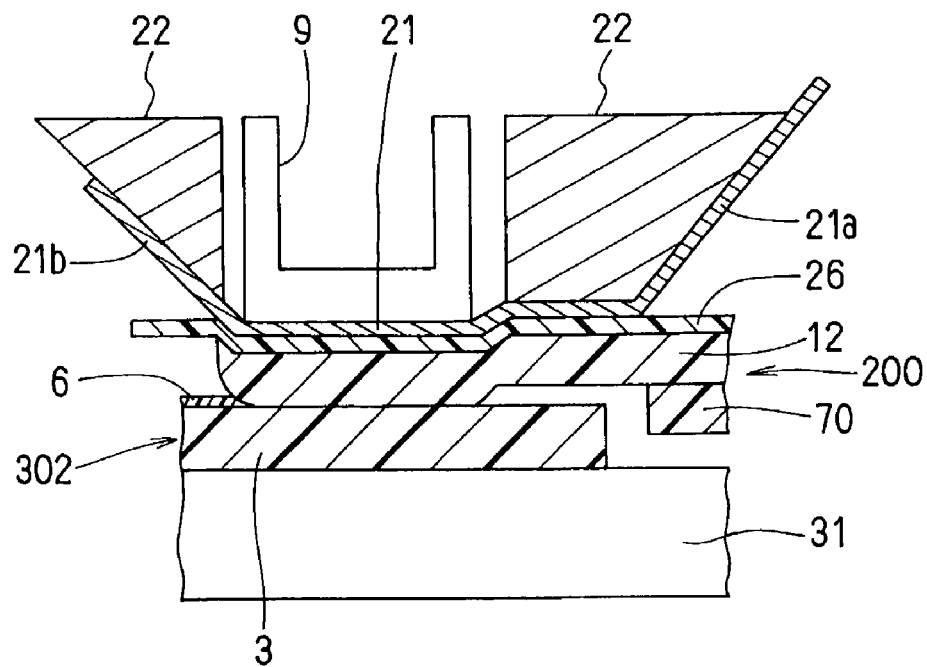

When the overlapped portion of the FPCB 200 and the RPCB 302 is heat pressed by the heat-pressing tool 9, the solder 8 melts to connect each land 13a of the silver patterns 13 to each corresponding land 4a of the copper pattern 4 as shown in FIG. 12A, and simultaneously the resin board 12 of the FPCB 200 is softened to bond the resin board 12 to the insulating board 3 as shown in FIG. 12B. During the heat pressing, heat is released from the resin board 12 of the FPCB 200 to the cooling member 22 through the intervening SUS member 21, so the temperature of the resin board 12 is low enough outside the heat pressed area.

Figure 14:
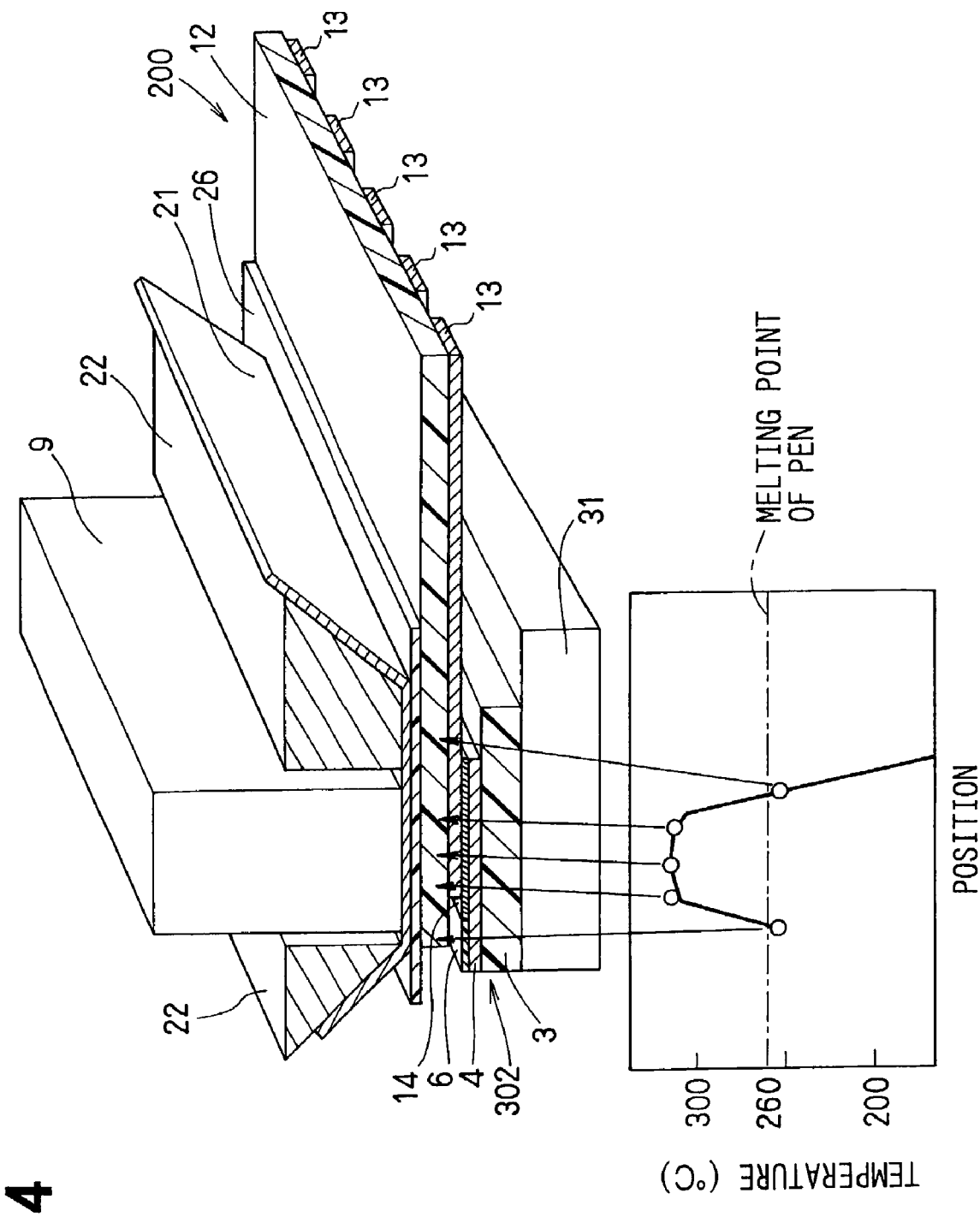
FIG. 14 is a view showing the temperature profile on the surface of a resin board under an SUS intervening member.

Specifically, as shown in FIG. 14, even when the maximum temperature of the resin board 12 is 310 to 320° C. in the heat pressed area, the resin board 12 has a temperature is lower than the melting point of PEN outside the heat pressed area. Therefore, the resin board 12 does not melt outside the heat pressed area. The thermal conductivity of the intervening SUS member 21 is preferably about 0.15 W/mm° C. or lower. Otherwise, the temperature of the resin board 12 increases too high outside the heat pressed area to remain at a temperature lower than the melting point of PEN because excessive heat is transmitted from the heat-pressing tool 9 to the intervening SUS member 21 and the cooling effect of the cooling member 22 decreases.

In the method of the FIG. 11B, the resin board 12 of the FPCB 200 is partially melted and pressed to the insulating board 3 in the heat pressed area, so the FPCB 200 and the RPCB 302 are bonded to provide a sufficient bonding strength. Simultaneously, the temperature of the resin board 12 is lower than the melting point of PEN outside the heat pressed area, so the resin board 12 does not melt outside the heat pressed area. Therefore, the melted resin of the resin board 12 is prevented from flowing toward outside the heat pressed area. Thus, the thickness of the FPCB 200 can be preferably controlled at the heat pressed area.

Specifically, an experiment conducted by the inventor showed that the resin board 12 had a thickness of 40 to 80 μm at the heat-pressed portion 12a when the resin board 12 had a thickness of 100 μm. Another experiment conducted by the inventor showed that the conductive silver patterns 13 were broken by the grinding stress caused by the flow of the melted resin of the resin board 12 if the thickness of the resin board 12 was lower than 20 μm on the lands 13a at the heat-pressed portion 12a. Therefore, the thickness of the thermoplastic resin board 12 is preferably 20% or more of its original thickness on the lands 13a at the heat-pressed portion 12a, and more preferably 40% or more. Thus, according to the method of FIG. 11B, the durability in the connection between the two conductive patterns 4, 13 is improved.

In the method of FIG. 11B, when the overlapped portion of the FPCB 200 and the RPCB 302 is heat pressed by a heat-pressing tool 9, the separator 26 is placed between the FPCB 200 and the intervening SUS member 21, so the melted resin of the resin board 12 is prevented from sticking to the intervening SUS member 21. However, the separator 26 may not be a film made of Teflon®. Instead, the intervening SUS member 21 may have a coated film made of Teflon® on the surface.

Figure 15:
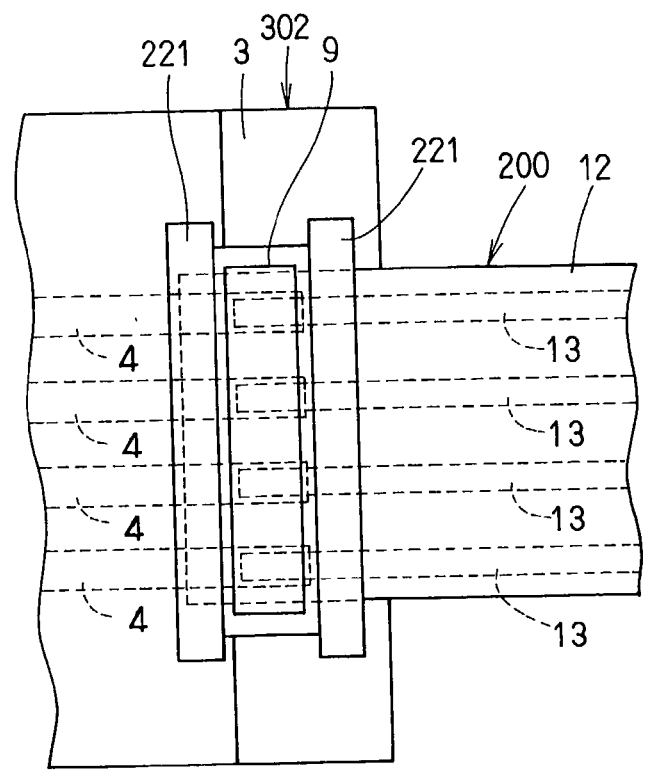
FIG. 15 is a schematic plan view showing a variation of the method according to the third embodiment.

In the method of FIG. 11B, the cooling member 22 is placed such that the heat-pressing tool 9 is enclosed by the cooling member 22 to cool the resin board 12 outside the heat pressed area, as shown in FIG. 13. However, instead of the cooling member 22, a pair of bar-like cooling members 221 may be placed such that the heat-pressing tool 9 is located between the bar-like cooling members 221, as shown in FIG. 15.

The silver patterns 13 extend substantially parallel to each other in the longitudinal direction of the FPCB 200, and the copper patterns 4 extend substantially parallel to each other in the longitudinal direction of the RPCB 302. Therefore, the melted resin of the resin board 12 mainly flows in the direction substantially parallel to the patterns 13, 4. Thus, the melted resin of the resin board 12 is sufficiently prevented from flowing outward from the heat pressed area by cooling the resin board 12 with the bar-like cooling members 221 at the two sides of the heat-pressing tool 9. Therefore, the thickness of the heat-pressed portion 12a of the FPCB 200 can be preferably controlled, so the grinding stress, which is otherwise imposed on the conductive silver patterns 13, is prevented. Thus, the durability in the connection between the two conductive patterns 4, 13 is improved using the method of FIG. 15.

Figure 16:
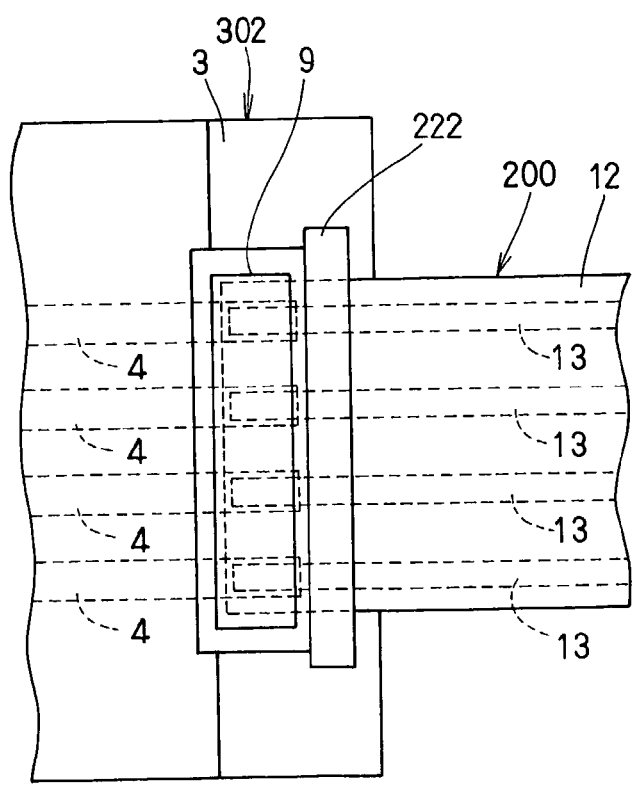
FIG. 16 is a schematic plan view showing another variation of the method according to the third embodiment.

Alternatively, a single bar-like cooling member 222 may be placed by the heat-pressing tool 9, as shown in FIG. 16. When the overlapped portion of the FPCB 200 and the RPCB 302 is heat pressed, the breakage of the conductive silver patterns 13, which is caused by the grinding stress, occurs more readily at the right side of the heat-pressed portion 12a in the lateral direction of FIG. 16. Therefore, the breakage of the conductive silver patterns 13 is prevented even by placing the bar-like cooling member 222 at the right side of the heat-pressing tool 9 alone, as shown in FIG. 16. Thus, the durability in the connection between the two conductive patterns 4, 13 is improved using the method of FIG. 16.

In the method of FIG. 11B, the first printed circuit board is not limited to the FPCB 200. The first printed circuit board may be an RPCB that includes an insulating board made of thermoplastic resin. The second printed circuit board is not limited to the RPCB 302. The second printed circuit board may be an FPCB. The second printed circuit board may be an RPCB that includes an insulating board made of thermoplastic resin. Moreover, the second printed circuit board may be an RPCB that includes an insulating board made of ceramics or metal. The resin board 12 of the FPCB 200 is not limited to PEN. Instead, the resin board 12 may be made of PET, PEI, PEEK, or a mixture of PEI and PEEK. Alternatively, the resin board 12 may be liquid crystal polymer. That is, the resin board 12 may include at least one of PEN, PET, PET, PEEK, and liquid crystal polymer.

In the method of FIG. 11B, the cooling member 22, which is made of copper, is used to efficiently release heat from the intervening SUS member 21 and to efficiently and partially cool the FPCB 200. However, the method to realize that purpose is not limited to the cooling member 22. For example, the following methods may be used as well. A metal block including a passage for a cooling medium is attached to the intervening SUS member 21, and a cooling medium such as water is run through the passage. Alternatively, a metal block including cooling fins is attached to the intervening SUS member 21. Alternatively, the slant portions 21a, 21b of the intervening SUS member 21 are cooled by cool air without the cooling member 22.

In the method of FIG. 11B, each land 4a of the conductive copper patterns 4 is connected to each corresponding land 13a of the silver patterns 13 with the solder leveler 8 (solder 14). However, a conductive adhesive and so on may be used instead of the solder leveler 8 (solder 14). Moreover, each land 4a and each corresponding land 13a may be directly connected. In the method of FIG. 11B, each land 4a and each land 13a are in a linear shape and have the same width as the copper patterns 4 and the silver patterns 13, respectively. However, the shape of the lands 4a, 13a may be rectangular, circular, and so on.

In the method of FIG. 11B, the FPCB 200 and the RPCB 302 are connected such that the FPCB 200 and the RPCB 302 have the heat pressed area at their longitudinal end and extend from the heat pressed area in the opposite direction. However, the FPCB 200 and the RPCB 302 may be connected such that the FPCB 200 and the RPCB 302 have the heat pressed area at their longitudinal end and extend from the heat pressed area in the same direction. Moreover, the FPCB 200 and the RPCB 302 may be connected such that the FPCB 200 and the RPCB 302 have the heat pressed area at a position except for their longitudinal end.

What is claimed is:

1. A method for connecting a pair of printed circuit board comprising steps of:
   preparing a first printed circuit board by forming a first conductive pattern, which includes a first land, on a first insulating board substantially made of thermoplastic resin;
   preparing a second printed circuit board by forming a second conductive pattern, which includes a second land, on a second insulating board;
   forming a solder on one of the first and second lands;
   overlapping the first and second printed circuit boards such that the first and second lands confront each other;
   heat pressing an overlapped portion of the first and second printed circuit boards with a heat-pressing tool at a temperature higher than the glass transition temperature of the thermoplastic resin; and
   cooling the first insulating board at an area adjacent to an area pressed by the heat-pressing tool to permit the thickness of the first insulating board to change gradually in the cooled area,
   wherein the first and second lands are electrically connected with the solder and the thermoplastic resin is softened and plastically deformed to bond the first insulating board to the second insulating board at the step of heat pressing.

2. The method in claim 1, wherein a plurality of the first conductive patterns that are substantially parallel to each other in the longitudinal direction of the first printed circuit board are formed at the step of preparing the first printed circuit board, and wherein the method further comprises a step of forming a protective film to cover the first conductive patterns such that the first insulating board is exposed between two of the first conductive patterns, which are adjacent to each other, in the area pressed by the heat-pressing tool.

3. The method in claim 2, wherein a plurality of the second conductive patterns that are substantially parallel to each other in the longitudinal direction of the second printed circuit board are formed at the step of preparing the second printed circuit board such that each second land of the second conductive patterns has a predetermined distance from an end of the second printed circuit board, and wherein the second insulating board is bonded to the first insulating board between two of the first conductive patterns in the predetermined distance.

4. The method in claim 1, wherein a cooling member is placed on the first insulating board at the area adjacent to the area pressed by the heat-pressing tool before the step of heat pressing, and wherein the cooling member is kept in contact with the first insulating board to cool the area adjacent to the area pressed by the heat-pressing tool during the step of heat pressing.

5. A method for connecting a pair of printed circuit board comprising steps of:
   preparing a first printed circuit board by forming a first conductive pattern, which includes a first land, on a first insulating board substantially made of thermoplastic resin;
   preparing a second printed circuit board by forming a second conductive pattern, which includes a second land, on a second insulating board;
   forming a solder on one of the first and second lands;
   overlapping the first and second printed circuit boards such that the first and second lands confront each other;
   heat pressing an overlapped portion of the first and second printed circuit boards with a heat-pressing tool having a plurality of projections at a temperature higher than the glass transition temperature of the thermoplastic resin such that the thickness of the first insulating board is smaller at areas pressed by the projections than the maximum thickness of the first insulating board at areas between the areas pressed by the projections, wherein the first and second lands are electrically connected with the solder and the thermoplastic resin is softened and plastically deformed to bond the first insulating board to the second insulating board at the step of heat pressing.

6. The method in claim 5, wherein a plurality of the first conductive patterns that are substantially parallel to each other in the longitudinal direction of the first printed circuit board are formed at the step of preparing the first printed circuit board, and wherein the method further comprises a step of forming a protective film to cover the first conductive patterns such that the first insulating board is exposed between two of the first conductive patterns, which are adjacent to each other, in the area pressed by the heat-pressing tool.

7. The method in claim 6, wherein the projections heat press the overlapped portion between the two of the first conductive patterns at the step of heat pressing.

8. The method in claim 6, wherein a plurality of the second conductive patterns that are substantially parallel to each other in the longitudinal direction of the second printed circuit board are formed at the step of preparing the second printed circuit board such that each second land of the second conductive patterns has a predetermined distance from an end of the second printed circuit board, and wherein the second insulating board is bonded to the first insulating board between the two of the first conductive patterns in the predetermined distance.

9. A method for connecting a pair of printed circuit board comprising steps of:
preparing a first printed circuit board by forming a first conductive pattern, which includes a first land, on a first insulating board substantially made of thermoplastic resin;
preparing a second printed circuit board by forming a second conductive pattern, which includes a second land, on a second insulating board;
overlapping to first and second printed circuit boards such that the first and second lands confront each other;
heat pressing an overlapped portion of the first and second printed circuit boards with a heat-pressing tool at a temperature higher than the melting point of the thermoplastic resin while the first insulating board is cooled at an area adjacent to an area pressed by the heat-pressing tool during the step of heat pressing such that the temperature of the first insulating board is kept lower than the melting point at the area adjacent to the area pressed by the heat-pressing tool, wherein the first and second lands are electrically connected with the solder and the thermoplastic resin is softened and plastically deformed to bond the first insulating board to the second insulating board at the step of heat pressing.

10. The method in claim 9, wherein the area adjacent to the area pressed by the heat-pressing tool is a frame-like region that encloses the area pressed by the heat-pressing tool at the step of heat pressing.

11. The method in claim 9, wherein the area adjacent to the area pressed by the heat-pressing tool is two bar-like regions, between which the area pressed by the heat-pressing tool is located at the step of heat pressing.

12. The method in claim 11, wherein a plurality of the first conductive patterns that are substantially parallel to each other in the longitudinal direction of the first printed circuit board are formed at the step of preparing the first printed circuit board, and wherein the two regions are adjacent to the area pressed by the heat-pressing tool in the longitudinal direction.

13. The method in claim 9, wherein the area adjacent to the area pressed by the heat-pressing tool is a bar-like region.

14. The method in claim 13, wherein a plurality of the first conductive patterns that are substantially parallel to each other in the longitudinal direction of the first printed circuit board are formed at the step of preparing the first printed circuit board, and wherein the bar-like region is adjacent to the area pressed by the heat-pressing tool in the longitudinal direction.

15. The method in claim 14, wherein the area pressed by the heat-pressing tool is located at an end of the first printed circuit board in the longitudinal direction, and wherein the bar-like region is located at a side of the area pressed by the heat-pressing tool far from the end in the longitudinal direction.

16. The method in claim 9, wherein a cooling member is placed at a side of the area pressed by the heat-pressing tool far from an end of the first printed circuit board in to longitudinal direction of the first printed circuit board to cool the area adjacent to the area pressed by the heat-pressing tool at the step of heat pressing.

17. The method in claim 16, wherein the overlapped portion is heat pressed by the heat-pressing tool with a thin-palate-like intervening member in-between, wherein the cooling member is in contact with the intervening member.

18. The method in claim 17, wherein the intervening member has a thermal conductivity of 0.15 W/mm° C. or lower.

19. The method in claim 9, wherein the thermoplastic resin includes one of polyethylenenaphthalate, polyethylenetelephthalate, polyetherimide, polyetheretherketone, and liquid crystal polymer.

20. The method in claim 9, wherein the overlapped portion is heated by the heat-pressing tool from the side where a surface of the first printed circuit board is exposed at the step of heat pressing, wherein a separator is placed on the surface, and wherein the surface is in contact with the separator during the step of heat pressing.

21. The method in claim 1, wherein the cooling of the first insulating board is performed simultaneously with the heat pressing of the overlapped portion of the first and second printed circuit boards.

* * * * *